(12) United States Patent
Kuramochi

(10) Patent No.: US 10,436,822 B2
(45) Date of Patent: *Oct. 8, 2019

(54) MEASUREMENT APPARATUS

(71) Applicant: ADVANTEST CORPORATION, Nerima-ku, Tokyo (JP)

(72) Inventor: Yasuhide Kuramochi, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 279 days.

This patent is subject to a terminal disclaimer.

(21) Appl. No.: 14/925,047

(22) Filed: Oct. 28, 2015

(65) Prior Publication Data

US 2016/0154033 A1 Jun. 2, 2016

(30) Foreign Application Priority Data

Nov. 28, 2014 (JP) ................................ 2014-242023

(51) Int. Cl.
*G01R 19/00* (2006.01)
*G01R 19/25* (2006.01)

(52) U.S. Cl.
CPC ......... *G01R 19/0053* (2013.01); *G01R 19/25* (2013.01)

(58) Field of Classification Search
None
See application file for complete search history.

(56) References Cited

U.S. PATENT DOCUMENTS

| | | | | | |
|---|---|---|---|---|---|
| 4,807,147 | A | * | 2/1989 | Halbert | ............... G01R 31/2834 324/76.15 |
| 2010/0072080 | A1 | * | 3/2010 | Karhanek | ........... G01N 27/4035 205/792 |

(Continued)

FOREIGN PATENT DOCUMENTS

| | | |
|---|---|---|
| JP | H04198702 A | 7/1992 |
| JP | H06300513 A | 10/1994 |

(Continued)

OTHER PUBLICATIONS

"Axon Axopatch 200B Microelectrode Amplifier" by Modular Devices, 2012.*

(Continued)

*Primary Examiner* — Paresh H Patel
(74) *Attorney, Agent, or Firm* — Cantor Colburn LLP

(57) ABSTRACT

A measurement apparatus is provided that measures a current signal $I_{DUT}$ that flows through a device under test. A transimpedance amplifier converts the current signal $I_{DUT}$ into a voltage signal $V_{OUT}$. A digitizer converts the voltage signal $V_{OUT}$ into digital data $D_{OUT}$. A digital signal processing unit performs signal processing on the digital data $D_{OUT}$, and controls the measurement apparatus. The measurement apparatus has a configuration comprising two separate modules, i.e., a probe module which is located in the vicinity of the device under test during a measurement, and a backend module connected to the probe module via at least one cable. The transimpedance amplifier is built into the probe module. The digitizer and the digital signal processing unit are built into the backend module.

16 Claims, 7 Drawing Sheets

(56) References Cited

U.S. PATENT DOCUMENTS

2010/0099198 A1\* 4/2010 Zhao ................ G01N 33/48721
                                                          436/149
2016/0153961 A1\* 6/2016 Kuramochi .......... C12Q 1/6869
                                                          204/403.01

FOREIGN PATENT DOCUMENTS

| JP | H11101807 A | 4/1999 |
| JP | 2003240747 A | 8/2003 |
| JP | 2006214792 A | 8/2006 |
| JP | 2008107216 A | 5/2008 |
| JP | 2010243494 A | 10/2010 |
| JP | 2013019853 A | 1/2013 |
| JP | 2013257334 A | 12/2013 |
| WO | 2009157187 A1 | 12/2009 |

OTHER PUBLICATIONS

"The Axon Guide—2500-0102 Rev. C" by Modular Devices, 2008.\*
"Bringing patch-clamp noise down to unprecedented leves" by AutoMate Science, 2015.\*
"Axopatch 200B" by Axon Instruments, 1998.\*
JP Notification of Reasons for Refusal corresponding to Application No. 2014-242022; dated Feb. 6, 2018.
JP Notification of Reasons for Refusal corresponding to Application No. 2014-242023; dated Feb. 6, 2018.
U.S. Non-Final Office Action corresponding to U.S. Appl. No. 14/925,022; dated Mar. 20, 2018.
USPTO Final Office Action corresponding to U.S. Appl. No. 14/925,022; dated Aug. 7, 2018.

\* cited by examiner

MEASUREMENT APPARATUS

CROSS-REFERENCE TO RELATED APPLICATIONS

The present invention claims priority under 35 U.S.C. § 119 to Japanese Application No. 2014-242023, filed Nov. 28, 2014, the entire content of which is incorporated herein by reference.

BACKGROUND OF THE INVENTION

Field of the Invention

The present invention relates to a measurement apparatus.

Description of the Related Art

In order to analyze the base sequence of DNA (deoxyribonucleic acid), RNA (ribonucleic acid), or the like, a base sequence analyzing apparatus (sequencer) is employed. As a next-generation (fourth-generation) sequencer, various kinds of techniques have been sought by research institutions and industries. As one of such prospective techniques, the gating nanopore sequencing technique has attracted attention.

With the gating nanopore sequencing technique, DNA or RNA is moved such that it passes through a gap between a pair of nanometer-order electrodes (nano-electrodes). The tunnel current that flows through the electrode gap changes according to the base type (A, G, T, C) that passes through the electrode gap. The base sequence is determined based on the change in the tunnel current. This technique is anticipated to have the potential to provide a very low-cost and very compact-size apparatus that is capable of analyzing a base sequence. It should be noted that, in the present specification, examples of such a "nano-electrode" include sub-micro electrodes and micro electrodes having a larger size.

Also, as a method using a tunnel current in the same way as with the gating nanopore sequencing technique, the MCBJ (Mechanically Controllable Break Junction) method has been developed. With the MCBJ method, a nano-electrode is formed by breaking a metal wire.

As an important element technology, such a sequencer requires a current measurement device that is capable of measuring a tunnel current that flows through a nano-electrode gap with sufficiently high precision. That is to say, such a tunnel current has a current value on the order of several tens of picoampere (pA). Accordingly, in order to judge the base type, there is a need to detect a difference in conductance on the order of several picoseconds (ps).

SUMMARY OF THE INVENTION

The present invention has been made in view of such a situation. Accordingly, it is an exemplary purpose of an embodiment of the present invention to provide a measurement apparatus which is capable of reducing the effects of noise, thereby providing high-precision current measurement.

An embodiment of the present invention relates to a measurement apparatus that measures a current signal that flows through a device under test. The measurement apparatus comprises: a transimpedance amplifier that converts the current signal into a voltage signal; a digitizer that converts the voltage signal into first digital data; and a digital signal processing unit that performs signal processing on the first digital data, and that controls the measurement apparatus. The measurement apparatus has a configuration comprising a first module and a second module which are separated one another, and the first module is located in the vicinity of the device under test during a measurement, and the second module is coupled to the first module via at least one cable. The transimpedance amplifier is built into the first module. The digitizer and the digital signal processing unit are built into the second module.

By providing the first module with such a transimpedance amplifier as a built-in component, such an arrangement allows the current signal $I_{DUT}$ to be converted into the voltage signal $V_{OUT}$ at a location in the vicinity of the device under test, which generates the voltage signal $V_{OUT}$. This reduces noise effects received by the transimpedance amplifier from the digital circuit, thereby providing high-precision measurement. Furthermore, by locating the transimpedance amplifier in the vicinity of the device under test, such an arrangement reduces the input capacitance, thereby providing wide-bandwidth current measurement.

The measured signal is transmitted in the form of analog data from the first module to the second module. The second module converts the measured signal thus received into a digital signal, and performs various kinds of digital processing on the digital signal thus converted. With such an arrangement, the first module does not require a clock signal as its internal signal for driving the digitizer and the digital signal processing unit, thereby providing reduced noise.

Also, the measurement apparatus may further comprise a transmitter amplifier that is built into the first module, and that transmits an output signal of the transimpedance amplifier to the digitizer.

By transmitting the voltage signal $V_{OUT}$ via the cable using such a transmitter amplifier having a large driving capacity, such an arrangement provides transmission of the voltage signal $V_{OUT}$ with improved noise tolerance.

Also, the transmitter amplifier may be configured as a differential output amplifier that transmits the voltage signal $V_{OUT}$ in a differential manner. Such an arrangement provides further improved noise tolerance.

Also, the measurement apparatus may further comprise a waveform generator that is built into the second module, that receives digital waveform data from the digital signal processing unit, and that generates an analog voltage that corresponds to the digital waveform data.

The analog voltage generated by the waveform generator may be used to drive the electrophoresis electrodes mounted on the device under test, or may be used to control the heater.

By mounting the waveform generator on the second module, such an arrangement is capable of preventing noise that occurs in the waveform generator from having an effect on the transimpedance amplifier.

The voltage level, amplitude, or waveform of the analog voltage may be adjusted based on the measurement result obtained by the digital signal processing unit. Such an arrangement is capable of supplying a suitable voltage to the device under test according to the state of the device under test.

Also, the measurement apparatus may further comprise a receiver amplifier that is built into the first module, that receives the analog voltage, and that outputs the analog voltage thus received to the device under test.

In this case, such an arrangement allows the analog voltage level output from the waveform generator to be reduced, thereby allowing noise emission to be reduced when the analog voltage is transmitted via the cable.

Also, the measurement apparatus may further comprise a waveform generator that is built into the first module, that receives digital waveform data, and that generates an analog voltage that corresponds to the digital waveform data.

In a case in which the waveform generator is built into the second module, the analog voltage is transmitted via the cable during the current measurement. Such an arrangement has the potential to have a problem of the occurrence of noise emission. In contrast, in a case in which the waveform generator is built into the first module, by transmitting the digital waveform data to the first module in a predetermined period in which current measurement is not performed, such an arrangement allows noise emission to be reduced during the current measurement.

Also, the aforementioned at least one cable may comprise a serial bus. Also, the digital signal processing unit may generate a first control signal for controlling the first module. Also, the digital signal processing unit may transmit the first control signal to the first module via the serial bus.

Also, the aforementioned at least one cable may comprise a dedicated signal line. Also, the digital signal processing unit may generate a second control signal for controlling the first module. Also, the digital signal processing unit may transmit the second control signal to the first module via the dedicated signal line.

Also, the measurement apparatus according to an embodiment may further comprise: a guard metal member formed within the first module such that the guard metal member is located in the vicinity of a signal line via which the current signal $I_{DUT}$ is transmitted; and a guard amplifier that is built into the first module, and that applies a virtual ground voltage of the transimpedance amplifier to the guard metal member.

With such an embodiment, the guard metal members prevent noise from mixing in the signal line, thereby further reducing noise. Furthermore, by adjusting the electric potentials at the guard metal members by means of the guard amplifier, such an arrangement is capable of setting the guard metal members and the signal line to the same electric potential. Such an arrangement reduces the effects of a parasitic capacitance that occurs between these components, thereby providing wide-bandwidth current measurement.

Also, the measurement apparatus according to an embodiment may further comprise a first voltage source that is built into the first module, and that generates a first voltage that determines the virtual ground voltage of the transimpedance amplifier.

By generating the first voltage that determines the virtual ground voltage at a location in the vicinity of the transimpedance amplifier, such an arrangement is capable of preventing noise from being superimposed on the virtual ground voltage. This reduces the noise component included in the current signal $I_{DUT}$ or otherwise the voltage signal $V_{OUT}$.

Also, the first voltage source may generate the first voltage having a voltage level that corresponds to setting data generated by the digital signal processing unit.

In this case, such an arrangement is capable of adjusting the voltage level of the first voltage according to the measurement result obtained by the digital signal processing unit. Furthermore, such an arrangement is capable of supplying a suitable voltage to the device under test according to the state of the device under test. Furthermore, in a case in which the first voltage is feedback controlled, by performing the feedback control operation by means of the first module alone without involving the second module, such an arrangement provides a high-speed control operation. Also, in this case, the data is used in the feedback control operation without involving data transmission via a cable, thereby reducing noise emission.

Also, the measurement apparatus according to an embodiment may further comprise a second voltage source that is built into the first module, and that generates a second voltage to be supplied to the device under test.

By generating the second voltage, which is to be supplied to the device under test, at a location in the vicinity of the device under test, such an arrangement is capable of preventing noise from being superimposed on the second voltage. This reduces the noise component included in the current signal $I_{DUT}$ or otherwise the voltage signal $V_{OUT}$.

Also, the second voltage source may generate the second voltage having a voltage level that corresponds to setting data generated by the digital signal processing unit.

In this case, such an arrangement is capable of adjusting the voltage level of the second voltage according to the measurement result obtained by the digital signal processing unit. Furthermore, such an arrangement is capable of supplying a suitable voltage to the device under test according to the state of the device under test. Furthermore, in a case in which the second voltage is feedback controlled, by performing the feedback control operation by means of the first module alone without involving the second module, such an arrangement provides a high-speed control operation. Also, in this case, the data is used in the feedback control operation without involving data transmission via a cable, thereby reducing noise emission.

Also, the device under test may comprise a first electrode to be connected to the transimpedance amplifier and a second electrode that faces the first electrode. Also, a measurement target of the measurement apparatus may be a current that flows between the first electrode and the second electrode. Also, the virtual ground voltage of the transimpedance amplifier may be set to the ground voltage. Also, the second voltage source may supply the second voltage to the second terminal.

With such an embodiment, the second voltage is used as a bias voltage for the electrode pair. By generating the bias voltage at a location in the vicinity of the device under test, such an arrangement is capable of preventing noise from being superimposed on the bias voltage. This reduces the noise component included in the current signal $I_{DUT}$ or otherwise the voltage signal $V_{OUT}$.

Also, the first module may comprise a power supply terminal for receiving a DC power supply voltage.

With such an arrangement, there is no need to mount a switching power supply that functions as a noise source within the first module. Thus, such an arrangement is capable of preventing switching noise from mixing in the input of the transimpedance amplifier or other circuit nodes.

Also, the measurement apparatus may further comprise a data storage built into the second module.

Also, such an arrangement may suspend access to the data storage during the measurement of a microscopic current (during the sampling operation of the digitizer). Thus, such an arrangement is capable of further reducing noise that occurs during the current measurement.

Also, the measurement apparatus may further comprise a data storage detachably connected to the second module.

In this case, after the completion of a series of measurement steps by means of the measurement apparatus, such an arrangement allows a computer to analyze the data stored in the data storage. Also, with such an arrangement, such a computer does not access the data during the measurement operation of the measurement apparatus, thereby providing reduced noise.

Also, the measurement apparatus may further comprise a PC interface built into the second module. Also, the measurement apparatus may suspend the data transmission between itself and a PC during measurement of a microscopic current. This allows noise to be further reduced during the current measurement.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

[Basic Configuration]

Figure 1:
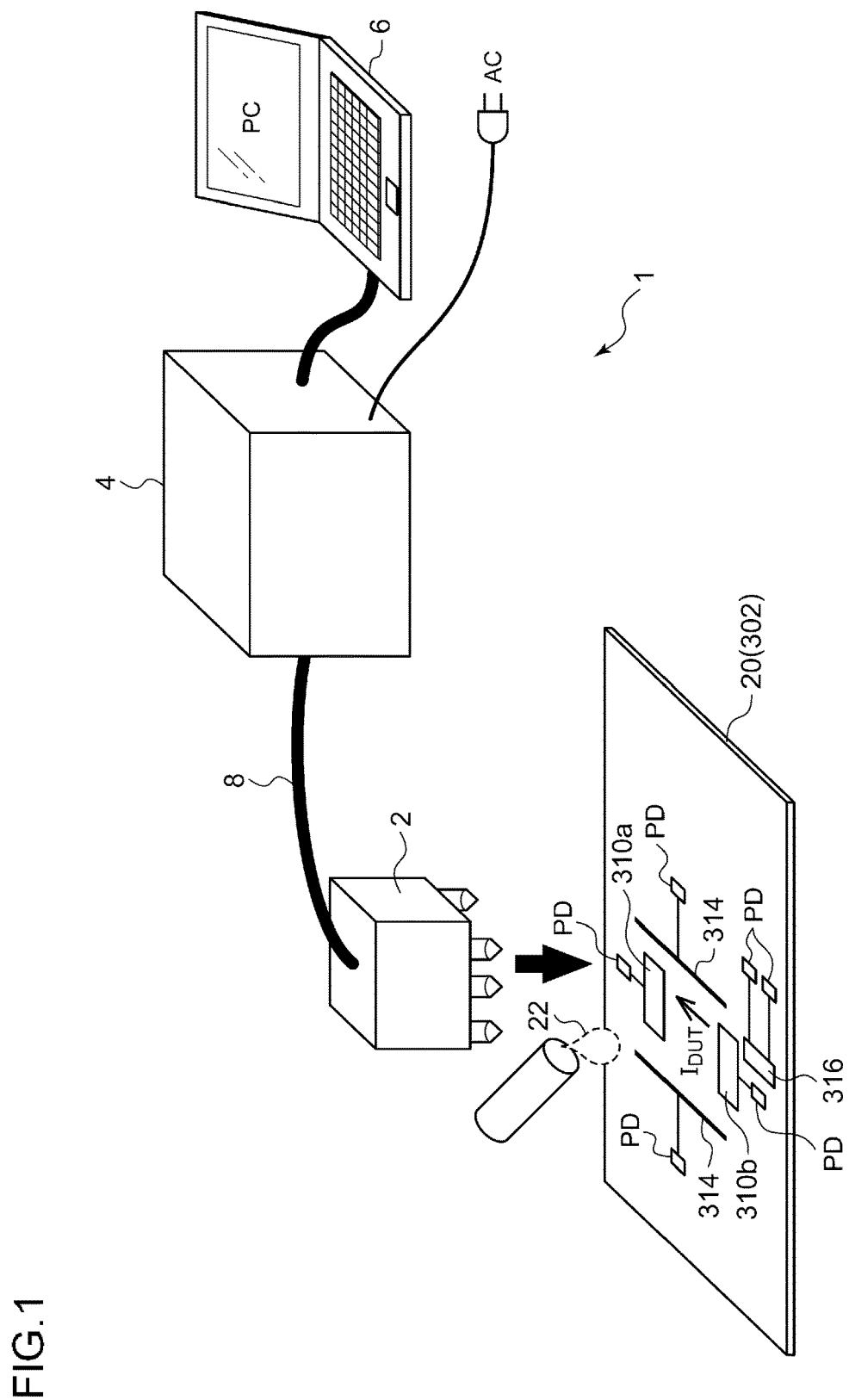
FIG. 1 is a block diagram showing a measurement apparatus according to an embodiment.

FIG. 1 is a block diagram showing a measurement apparatus 1 according to an embodiment. With the present embodiment, the measurement apparatus 1 is configured as a base sequence analyzing apparatus (sequencer).

For example, a device under test 20 is configured as a measurement chip (nanopore chip 302). The nanopore chip 302 includes an electrode pair 310, a pair of electrophoresis electrodes 314, a nanochannel, a nanopore structure, and the like formed on it. By controlling a DNA sample 22 such that it passes through the unshown nanochannel, such an arrangement is capable of separating and extracting such a DNA sample 22 in the form of a single molecule, thereby allowing the DNA sample 22 to be analyzed as a linear sample.

An analog voltage generated by the measurement apparatus 1 is applied to the electrophoresis electrodes 314. In this state, an electric field is generated between the electrophoresis electrodes 314 according to the analog voltage thus applied. Such an arrangement is capable of controlling the position of a DNA molecule.

The electrode pair 310 is formed within the nanopore structure (not shown). When a DNA molecule passes through the gap between the electrode pair 310, a tunnel current $I_{DUT}$ flows between the electrode pair 310 according to the DNA molecule base type that passes through the gap between the electrode pair 310. The measurement apparatus 1 identifies the base type based on the tunnel current (current signal) $I_{DUT}$.

A heater (heat source) 316 is arranged in the vicinity of the electrode pair 310 so as to control the temperature of the nanopore chip 302. A current is supplied to the heater 316 according to a signal received from the measurement apparatus 1, thereby generating Joule heat. The measurement apparatus 1 controls the amount of heat generation of the heater 316 so as to maintain the temperature at a location in the vicinity of the electrode pair 310 of the device under test 20 at a constant level.

Multiple pads PD are formed on the nanopore chip 302 so as to allow a signal to be supplied to each of the electrode pair 310, the electrophoresis electrodes 314, and the heater 316.

The measurement apparatus 1 measures the current signal $I_{PUT}$ that flows through the device under test 20.

The measurement apparatus 1 is mainly configured as two separate modules, i.e., an active probe module (first module, which will simply be referred to as the "probe module" hereafter) 2, and a digital backend module (second module, which will simply be referred to as the "backend module") 4. When the measurement is performed, the probe module 2 is set in the vicinity of the device under test 20. For example, probes or pins are provided to the probe module 2 such that they can be in contact with the pads PD formed on the device under test 20. The probe module 2 may be configured to be movable in the vertical direction. The backend module 4 is connected to the probe module 2 via at least one cable 8. The probe module 2 mainly mounts an analog frontend circuit. The backend module 4 mainly mounts a digital circuit.

Preferably, the probe module 2 and the backend module 4 are each covered by a metal housing so as to block external noise.

The measurement apparatus 1 measures the current signal $I_{DUT}$ that flows through the device under test 20, converts the current signal $I_{DUT}$ into a digital value, and identifies the base type based on the digital value thus converted. Furthermore, as described above, the measurement apparatus 1 supplies an appropriate voltage to the electrophoresis electrodes 314 and the electrode pair 310, and controls the heater 316.

The backend module 4 is connected to a computer 6. The computer 6 executes a program in order to control the probe module 2, the backend module 4, and other hardware components 10, 12, and 14.

Figure 2:
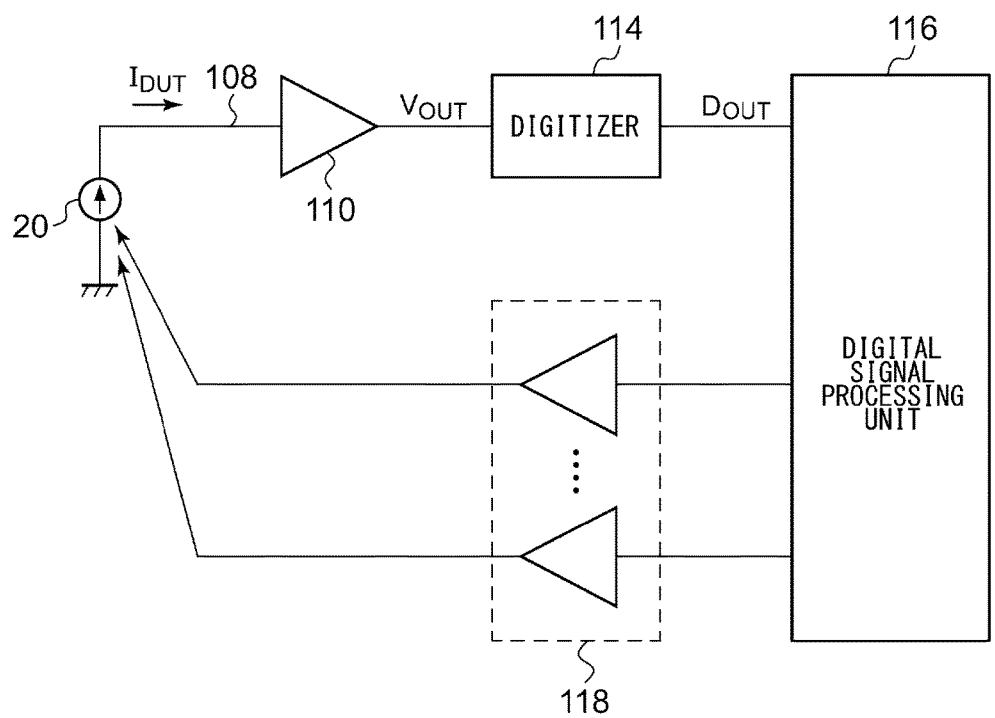
FIG. 2 is a function block diagram showing a measurement apparatus.

FIG. 2 is a function block diagram showing the measurement apparatus 1. The measurement apparatus 1 mainly includes a transimpedance amplifier 110, a digitizer 114, and a signal generating circuit 118.

The transimpedance amplifier 110 receives, via a signal line 108, the current signal $I_{DUT}$ generated by the device under test 20. Furthermore, the transimpedance amplifier 110 converts the current signal $I_{DUT}$ thus received into a voltage signal $V_{OUT}$. The digitizer 114 converts the voltage signal $V_{OUT}$ into digital data $D_{OUT}$. The digital signal processing unit 116 performs, based on the digital data $D_{OUT}$, a part of or otherwise all the steps of the digital signal processing necessary for identifying the base type. Description will be made in the present embodiment regarding an arrangement in which the digital signal processing unit 116 performs all the steps of the calculation for identifying the base type.

The signal generating circuit 118 generates various kinds of signals to be supplied to the device under test 20. Examples of such signals include: a signal for controlling the electrophoresis electrodes; a signal for controlling the heater; a signal for biasing the electrode pair; and the like. Furthermore, the digital signal processing unit 116 controls the measurement apparatus 1. For example, the digital signal processing unit 116 is provided with a function for controlling the signal generating circuit 118.

The above constitutes a function block diagram of the measurement apparatus 1. Next, description will be made regarding a specific configuration of the measurement apparatus 1. The present inventors have come to recognize the fact that the measurement precision is greatly affected by what kinds of circuit components are included, and by what kind of layout is employed, in the measurement apparatus 1 shown in FIG. 2. Description will be made below regarding a configuration which allows the effects of noise to be reduced, thereby providing high-precision current measurement.

Figure 3:
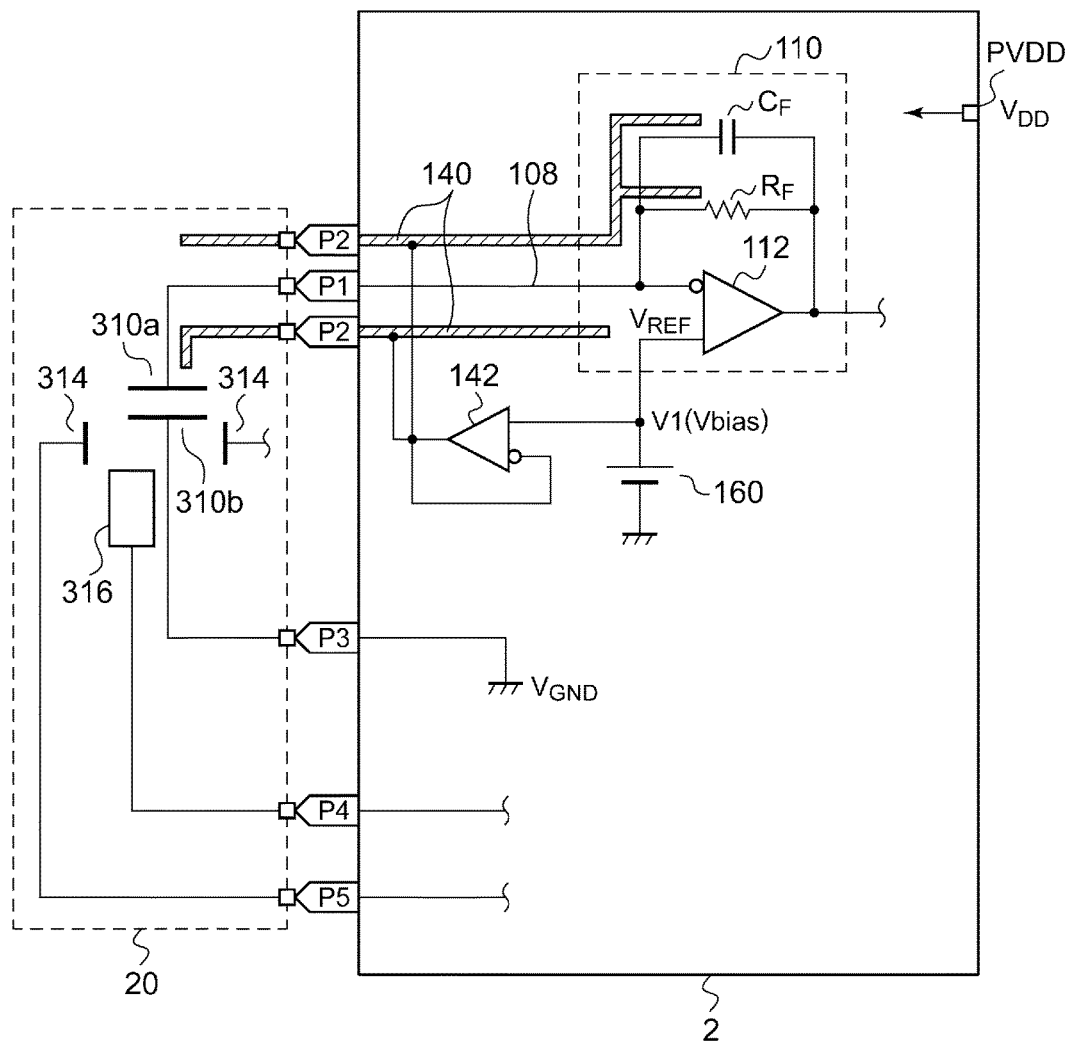
FIG. 3 is a circuit diagram showing an active probe module according to a first example configuration.

First, description will be made regarding a basic configuration. FIG. 3 is a circuit diagram showing the probe module 2 according to a first example. In the present embodiment, the transimpedance amplifier 110 is mounted on the probe module 2. Furthermore, the probe module 2 includes a guard amplifier 142 and a first voltage source 160 as its built-in components. In addition to such circuit components, the probe module 2 may mount other circuit components, which will not be described for ease of understanding and simplification of description.

The transimpedance amplifier 110 includes an inverting amplifier 112, a feedback resistor $R_F$, and a feedback capacitor $C_F$. The feedback resistor $R_F$ and the feedback capacitor $C_F$ are arranged in parallel between the inverting input terminal and the output terminal of the inverting amplifier 112.

By providing the probe module 2 with the transimpedance amplifier 110 as a built-in component, such an arrangement is capable of converting the current signal $I_{DUT}$ into the voltage signal $V_{OUT}$ in the vicinity of the device under test 20 that generates the current signal $I_{DUT}$. Thus, such an arrangement reduces the noise effects of a digital circuit (not shown) on the transimpedance amplifier 110, thereby providing high-precision measurement. Furthermore, by arranging the transimpedance amplifier 110 such that it is directly in contact with the device under test 20, such an arrangement allows the input capacitance to be reduced. Thus, such an arrangement provides current measurement over a wide bandwidth.

Guard metal members 140 are formed within the probe module 2 such that they are arranged in the vicinity of the signal line 108. The guard metal members 140 may be arranged such that they cover the signal line 108. Preferably, the guard metal members 140 are arranged such that they extend to a location in the vicinity of the input side of the feedback capacitor $C_F$ and a location in the vicinity of the input side of the feedback resistor $R_F$. The guard amplifier 142 is included in the probe module 2 as its built-in component. The guard amplifier 142 applies a virtual ground voltage $V_{REF}$ of the transimpedance amplifier 110 to the guard metal members 140.

Such a configuration allows the guard metal members 140 to block noise mixing in the signal line 108, thereby further reducing noise. Furthermore, by adjusting the electric potential at the guard metal members 140 by means of the guard amplifier 142, such an arrangement is capable of controlling the electric potentials at the guard metal members 140 and the electric potential of the signal line 108 so as to be the same electric potential. Thus, such an arrangement is capable of reducing the effects of a parasitic capacitance that can occur between the guard metal member 140 and the signal line 108, thereby allowing current measurement over a wide bandwidth.

The first voltage source 160 is built into the probe module 2. The first voltage source 160 generates a first voltage V1. The first voltage V1 is supplied to the non-inverting input terminal of the inverting amplifier 112 of the transimpedance amplifier 110 so as to determine the virtual ground voltage $V_{REF}$. The ground voltage $V_{GND}$ (=0 V) is supplied to a second electrode 310b from the probe module 2.

By providing the probe module 2 with the first voltage source 160 as its built-in component, and by generating the first voltage V1 that determines the virtual ground voltage $V_{REF}$ in the vicinity of the transimpedance amplifier 110, such an arrangement is capable of preventing noise from being superimposed on the virtual ground voltage $V_{REF}$. This reduces the noise component of the current signal $I_{DJT}$ or otherwise the noise component of the voltage signal $V_{OUT}$.

In a stable state of the transimpedance amplifier 110, the electric potentials at the inverting input terminal and the non-inverting input terminal of the inverting amplifier 112 are both stabilized to the virtual ground voltage $V_{REF}$. The virtual ground voltage $V_{REF}$ is supplied to a first electrode 310a via the signal line 108. Accordingly, the virtual ground voltage $V_{REF}$ (first voltage V1) is supplied as a bias voltage $V_{BIAS}$ between the first electrode 310a and the second electrode 310b. From this viewpoint, it can be understood that the first voltage V1 determines the bias voltage $V_{BIAS}$ applied between the first electrode 310a and the second electrode 310b.

The probe module 2 is provided with a power supply terminal PVDD for receiving a DC power supply voltage $V_{DD}$. Accordingly, the built-in components of the probe module 2 include no switching power supply generating switching noise. Each active device built into the probe module 2 operates receiving the power supply voltage $V_{DD}$.

There is no need to provide such a switching power supply that functions as a noise source as a built-in component of the probe module 2. Thus, such an arrangement is capable of preventing switching noise from mixing in the input of the transimpedance amplifier 110 or other circuit nodes.

The above is the first example configuration of the probe module 2.

Figure 4:
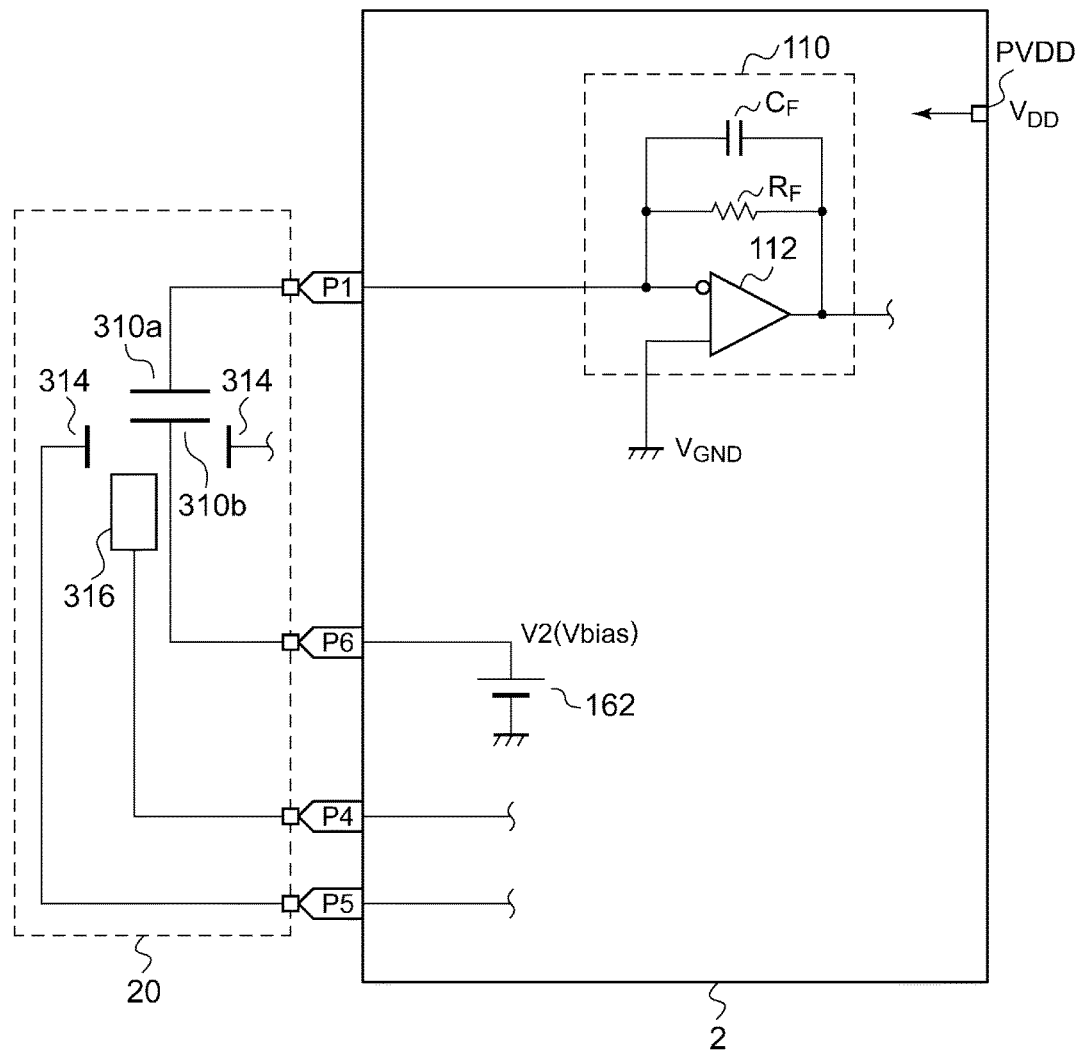
FIG. 4 is a circuit diagram showing an active probe module according to a second example configuration.

FIG. 4 is a circuit diagram showing the probe module 2 according to a second example configuration. As with the first example configuration, the transimpedance amplifier 110 is built into the probe module 2. Thus, such an arrangement is capable of reducing the effect of noise received from a digital circuit (not shown) on the transimpedance amplifier 110, thereby providing high-precision measurement. Furthermore, by arranging the transimpedance amplifier 110 such that it is directly in contact with the device under test 20, such an arrangement allows the input capacitance to be reduced, thereby providing wide-bandwidth current measurement.

A second voltage source 162 is built into the probe module 2. The second voltage source 162 generates a second voltage V2 to be supplied to the device under test 20.

With such a configuration example, the non-inverting input terminal of the inverting amplifier 112 included in the transimpedance amplifier 110 is grounded. Accordingly, the virtual ground voltage is set to the ground voltage $V_{GND}$. The second voltage V2 generated by the second voltage source 162 is supplied to the second electrode 310b. With the transimpedance amplifier 110 in a stable state, the electric potentials at the inverting input terminal and the non-inverting input terminal of the inverting amplifier 112 are both stabilized to the virtual ground voltage $V_{GND}$. The virtual ground voltage $V_{GND}$ is supplied to the first electrode 310a via the signal line 108. When the second voltage V2 is supplied to the second electrode 310b, the second voltage V2 is supplied as the bias voltage $V_{BIAS}$ between the first electrode 310a and the second electrode 310b. From this viewpoint, it can be understood that the second voltage V2 determines the bias voltage $V_{BIAS}$ applied between the first electrode 310a and the second electrode 310b.

With such an arrangement, the second voltage V2, which is to be supplied to the device under test 20, is generated in the vicinity of the device under test 20. Thus, such an arrangement is capable of preventing noise from being superimposed on the second voltage V2. This reduces the noise component of the current signal $I_{DUT}$ or the noise component of the voltage signal $V_{OUT}$.

As with an arrangement shown in FIG. 3, the probe module 2 is provided with the power supply terminal PVDD for receiving the DC power supply voltage $V_{DD}$. Each active device built into the probe module 2 operates receiving the power supply voltage $V_{DD}$. Thus, a built-in switching power supply can be eliminated from the probe module 2, thereby reducing noise effects.

The above is the second example configuration of the probe module 2. Next, detailed description will be made regarding a specific overall configuration of the measurement apparatus 1.

[First Embodiment]

Figure 5:
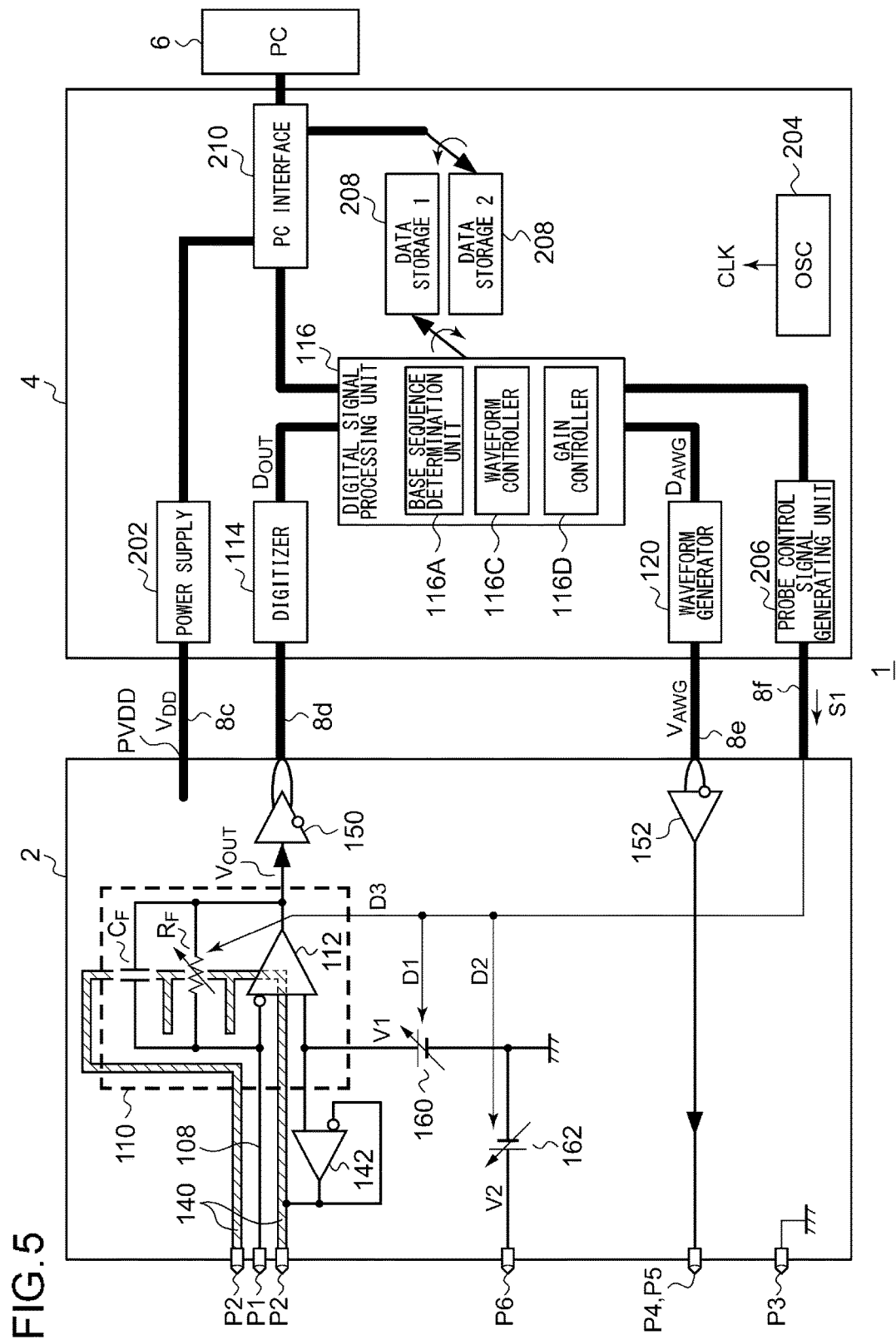
FIG. 5 is a block diagram showing a configuration of a measurement apparatus according to a first embodiment.

FIG. 5 is a block diagram showing a configuration of the measurement apparatus 1 according to a first embodiment. In FIG. 5, the probe module 2 mainly performs analog signal processing. The probe module 2 and the backend module 4 are connected to each other via multiple cables 8c through 8f. The cable (power supply line) 8c is used to supply a DC power supply voltage $V_{DD}$ from the backend module 4 to the probe module 2. The cable 8d is used to transmit, to the backend module 4, an analog voltage signal $V_{OUT}$ generated by the transimpedance amplifier 110. The cables 8e and 8f are used to transmit, to the probe module 2, a digital signal generated by the backend module 4 for controlling the probe module 2.

First, description will be made regarding the probe module 2. The probe module 2 shown in FIG. 5 has a hybrid configuration obtained by combining the first example configuration shown in FIG. 3 and the second example configuration shown in FIG. 4. The probe module 2 includes a first voltage source 160, a second voltage source 162, guard metal members 140, and a guard amplifier 142. Furthermore, the probe module 2 further includes a transmitter amplifier 150 and a receiver amplifier 152.

The backend module 4 includes a digitizer 114, a digital signal processing unit 116, a waveform generator 120, an oscillator 204, a probe control signal generating unit 206, a data storage 208, and a PC interface 210.

In FIG. 5, the measured signal $V_{OUT}$ is transmitted between the probe module 2 and the backend module 4 via an analog interface.

The transmitter amplifier 150 transmits the output $V_{OUT}$ of the transimpedance amplifier 110 to the backend module 4 via the cable 8d. The transmitter amplifier 150 is configured as a differential output amplifier. The transmitter amplifier 150 may transmit the voltage signal $v_{OUT}$ in the form of a differential signal. Such an arrangement provides improved noise tolerance.

The digitizer 114 built into the backend module 4 converts the voltage signal $V_{OUT}$ received from the probe module 2 into digital data $D_{OUT}$. The digital signal processing unit 116 identifies the base type based on the digital data $D_{OUT}$ as described above. Furthermore, the digital signal processing unit 116 controls the overall operation of the probe module 2 and the backend module 4 according to the digital data $D_{OUT}$ and/or a control instruction received from the computer 6.

As described above, the backend module 4 converts the measured signal $V_{OUT}$ into the digital signal $D_{OUT}$. Furthermore, various kinds of digital signal processing are performed within the backend module 4. With such an arrangement, the probe module 2 does not require a clock signal for driving the digitizer 114 and the digital signal processing unit 116. Such an arrangement provides reduced noise, thereby providing high-precision current measurement.

The oscillator 204 generates a clock signal CLK. The backend module 4 operates in synchronization with the clock signal CLK.

The digital signal processing unit 116 includes multiple digital signal processing units 116A, 116C, and 116D. The digital signal processing unit 116 may be configured as a CPU (Central Processing Unit), DSP (Digital Signal Processor), ASIC (Application Specific Integrated Circuit), FPGA (Field Programmable Gate Array), or the like.

The first digital signal processing unit (processor) 116A receives the digital data $D_{OUT}$, and performs a series of signal processing steps for determining the base sequence based on the digital data $D_{OUT}$. The processing and algorithms employed in the first digital signal processing unit 116A are not restricted in particular. The first digital signal processing unit 116A sequentially writes each base type of a base sequence to the data storage 208.

The digital signal processing unit 116 and the probe control signal generating unit 206 may perform a feedback control operation according to the digital data $D_{OUT}$. The probe control signal generating unit 206 generates a first control signal S1 for controlling the probe module 2, and outputs the first control signal S1 thus generated to the probe module 2 via the cable 8f. The first control signal S1 may be transmitted in the form of serial data. The first control signal S1 may include: data (D1) for controlling the first voltage V1; data (D2) for controlling the second voltage V2; data (D3) for controlling the gain of the transimpedance amplifier 110; and the like.

The first voltage source 160 is configured as a variable voltage source. The first voltage source 160 generates the first voltage V1 having a voltage level that corresponds to the setting data D1 generated by the probe control signal generating unit 206. With such an arrangement, the voltage level of the first voltage V1 can be adjusted according to the measurement result (i.e., the digital data $D_{OUT}$) obtained by the digital signal processing unit 116. That is to say, such an arrangement is capable of applying a suitable voltage to the device under test 20 according to the state of the device under test 20.

For example, as a conceivable problem, a signal level of the current signal $I_{DUT}$ can degrade due to abrasion or contamination of the electrode pair 310. In this case, by controlling the first voltage V1 so as to raise the bias voltage $V_{BIAS}$, such an arrangement allows the current signal $I_{DUT}$ to have a large signal level, thereby providing an improved S/N ratio.

The second voltage source 162 is configured as a variable voltage source. The second voltage source 162 generates the second voltage V2 having a voltage level that corresponds to the setting data D2 generated by the probe control signal generating unit 206. With such an arrangement, the voltage level of the second voltage V2 can be adjusted according to the measurement result (i.e., the digital data $D_{OUT}$) obtained by the digital signal processing unit 116. That is to say, such an arrangement is capable of applying a suitable voltage to the device under test 20 according to the state of the device under test 20.

For example, as a conceivable problem, a signal level of the current signal $I_{DUT}$ can degrade due to abrasion or contamination that occurs in the electrode pair 310. In this case, by controlling the second voltage V2 so as to raise the bias voltage $V_{BIAS}$, such an arrangement is capable of allowing the current signal $I_{DUT}$ to have a large signal level, thereby providing an improved S/N ratio.

The waveform generator 120 receives digital waveform data $D_{AWG}$ generated by the third digital signal processing unit 116C of the digital signal processing unit 116. Furthermore, the waveform generator 120 generates an analog voltage $V_{AWG}$ according to the digital waveform data $D_{AWG}$. The analog voltage $V_{AWG}$ thus generated is transmitted to the probe module 2 via the cable 8e. Preferably, the waveform generator 120 transmits the analog voltage $V_{AWG}$ in the form of a differential signal. Such an arrangement provides improved noise tolerance.

The probe module 2 is provided with a receiver amplifier 152 that receives the analog voltage $V_{AWG}$. In a case in which the analog voltage $V_{AWG}$ is directly supplied to the device under test 20 via a cable provided within the probe module 2 instead of providing such a receiver amplifier 152, there is a need to design the waveform generator 120 to have a high driving capacity (i.e., to have a low output impedance), and to design the analog voltage $V_{AWG}$ transmitted via the cable 8e to have a large amplitude. Such an arrangement leads to a marked increase in noise emission due to the analog voltage $V_{AWG}$. In some cases, this leads to degraded precision of the transimpedance amplifier 110. In order to solve such a problem, the receiver amplifier 152 is provided in order to allow the analog voltage $V_{AWG}$ transmitted via the cable 8e to have a reduced amplitude, thereby providing reduced noise.

The analog voltage $V_{AWG}$ is supplied via a pin P4, and is used to perform a heater control operation. Alternatively, the analog voltage $V_{AWG}$ is supplied to the electrophoresis electrodes 314 via a pin P5. Also, multiple waveform generators 120 may be provided so as to generate multiple analog voltages $V_{AWG}$. The waveform generator 120 may be configured as a so-called arbitrary waveform generator. Also, the waveform generator 120 may be configured as a function generator, a D/A converter, or otherwise as another kind of voltage source or signal generator.

The digital waveform data $D_{AWG}$ is generated by the third digital signal processing unit 116C built into the backend module 4. For example, in a case in which the analog voltage $V_{AWG}$ is supplied to the electrophoresis electrodes 314, the analog voltage $V_{AWG}$ corresponds to a signal for controlling the position of a DNA molecule. The third digital signal processing unit 116C may estimate the position and the velocity of each base based on the first digital data D1, and may adjust the analog voltage $V_{AWG}$ according to the estimation result thus obtained. Also, the third digital signal processing unit 116C may control the analog voltage $V_{AWG}$ using an open loop control method.

In a case in which the analog voltage $V_{AWG}$ is used to control the heater 316, the analog voltage $V_{AWG}$ corresponds to a signal for controlling the temperature of the device under test 20. The third digital signal processing unit 116C may estimate a change in temperature based on the digital data $D_{OUT}$, and may adjust the analog voltage $V_{AWG}$ according to the estimation result thus obtained. Also, the third digital signal processing unit 116C may control the analog voltage $V_{AWG}$ using an open loop control method.

The gain controller 116D generates the setting value of the gain of the transimpedance amplifier 110. The probe control signal generating unit 206 generates the setting data D3 based on the setting value of the gain. For example, the feedback resistor $R_F$ of the transimpedance amplifier 110 is configured as a variable resistor. Specifically, the resistance value of the feedback resistor $R_F$ can be changed according to the setting data D3. Such an arrangement allows the gain to be adjusted based on the measurement result (i.e., digital data $D_{OUT}$) obtained by the digital signal processing unit 116.

For example, as a conceivable problem, a signal level of the current signal $I_{DUT}$ can degrade due to abrasion or contamination of the electrode pair 310. In this case, by raising the gain, such an arrangement allows the current signal $I_{DUT}$ to have a large signal level, thereby providing an improved S/N ratio.

The backend module 4 includes a power supply 202 as a built-in component. The power supply 202 generates the power supply voltage $V_{DD}$, and supplies the power supply voltage $V_{DD}$ thus generated to the probe module 2 via the power supply line 8c. It should be noted that the power supply voltage $V_{DD}$ used in the probe module 2 may be supplied from an external power supply to the backend module 4.

The backend module 4 mounts one or multiple data storages 208. Each data storage 208 may be configured as a hard disk or an SSD (Solid State Drive). The data storage 208 stores the data that represents a base sequence.

The data access timing at which the data storage 208 is accessed may be controlled by the measurement apparatus 1, and more specifically, by the digital signal processing unit 116. The digital signal processing unit 116 has information with respect to a period for which the digitizer 114 samples a microscopic current. Thus, the digital signal processing unit 116 may suspend access to the data storage 208 during the measurement of a microscopic current. Thus, such an arrangement is capable of further reducing noise that occurs during the current measurement.

The PC interface 210 is provided in order to allow the computer 6 to be connected to the measurement apparatus 1. The computer 6 controls the backend module 4 and the probe module 2 via the PC interface 210. Furthermore, the computer 6 accesses the data storage 208 so as to read out the base sequence data stored in the data storage 208. The data read-out operation of the computer 6 and the data writing operation of the digital signal processing unit 116 are performed in an exclusive manner.

[Second Embodiment]

Figure 6:
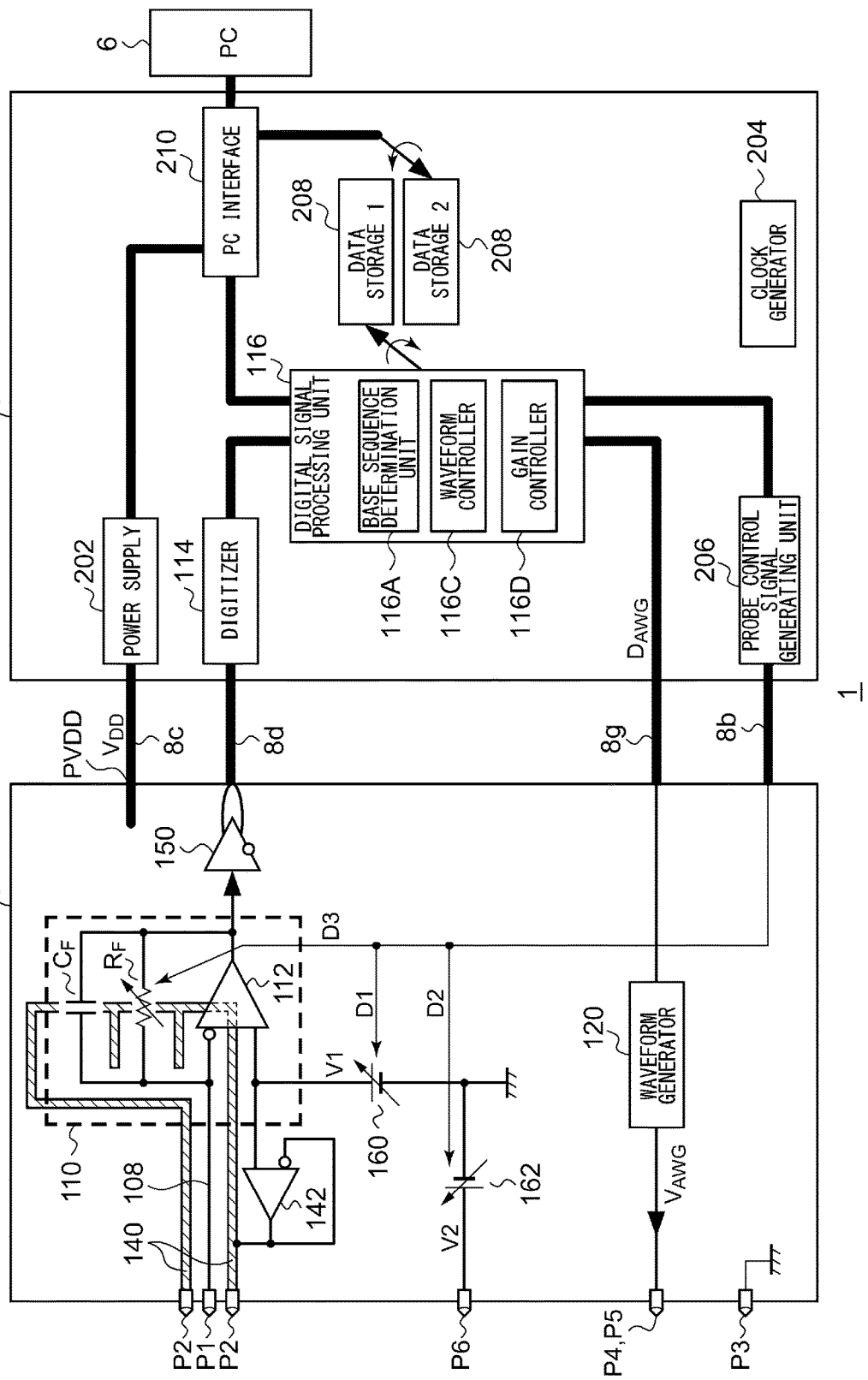
FIG. 6 is a block diagram showing a configuration of a measurement apparatus according to a second embodiment.

FIG. 6 is a block diagram showing a configuration of a measurement apparatus according to a second embodiment. The point of difference between the first embodiment and the second embodiment is that, in the second embodiment, the waveform generator 120 is built into the probe module 2. The other configuration is the same as that of the first embodiment. The digital waveform data $D_{AWG}$ is generated by the third digital signal processing unit 116C included in the backend module 4, and is transmitted via the cable 8g.

In a case in which the waveform generator 120 is built into the backend module 4 as described in the first embodiment, the analog voltage $V_{AWG}$ is transmitted via the cable 8e during the current measurement. Thus, such an arrangement has the potential to have a problem of the occurrence of noise emission. In contrast, in a case in which the waveform generator 120 is built into the probe module 2, by transmitting the digital waveform data $D_{AWG}$ to the probe module 2 in a predetermined period in which the current is not measured, such an arrangement is capable of reducing noise emission during the current measurement.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made in the embodiment regarding an arrangement in which the probe module 2 and the digital signal processing unit 116 of the backend module 4 perform processing up to a base sequence determination. However, the present invention is not restricted to such an arrangement. Also, the digital signal processing unit 116 may perform processing up to an intermediate step without performing a base sequence determination, and may store intermediate data in the data storage 208. Subsequently, the computer 6 may execute final processing for completing the base sequence determination.

[Second Modification]

Description has been made in the embodiment regarding an arrangement in which the first control signal S1 (D1 through D3) for controlling the probe module 2 is transmitted in the form of serial data. However, the present invention is not restricted to such an arrangement. Also, at least a part of the first control signal S1 (second control signal S2) for controlling the probe module 2 may be supplied to the probe module 2 via a dedicated control line.

Figure 7:
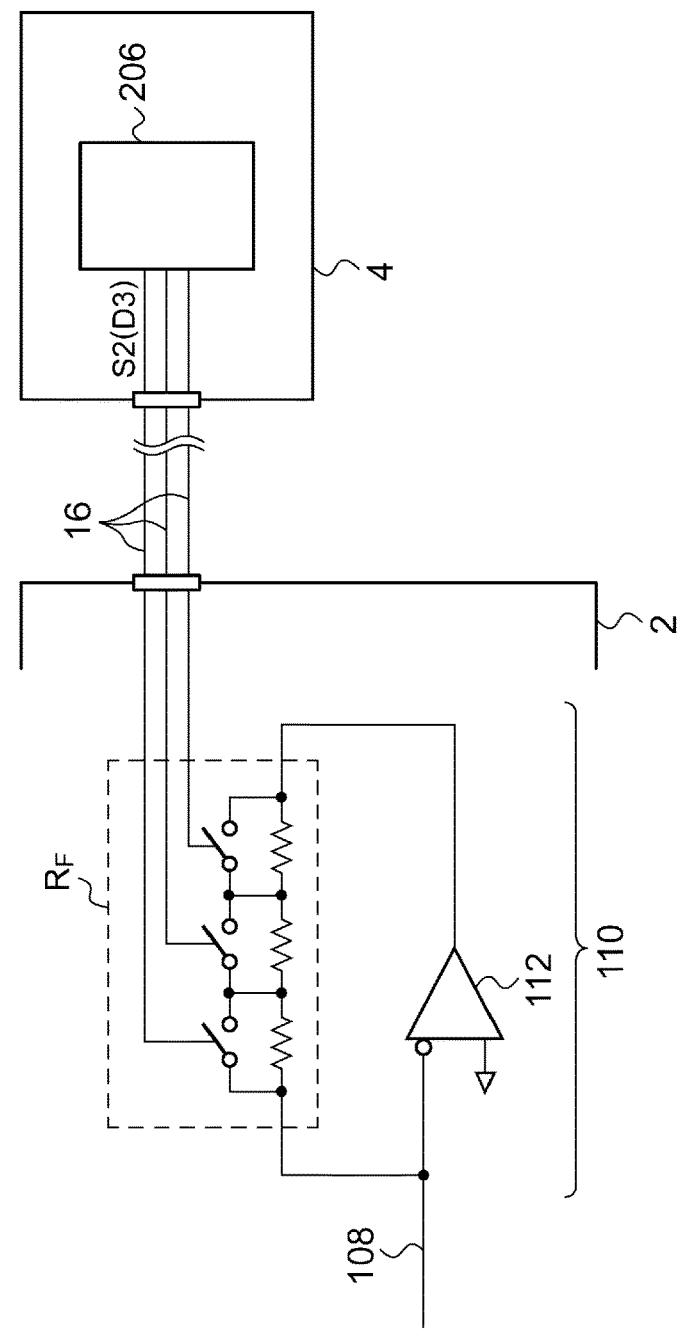
FIG. 7 is a circuit diagram showing a part of the configuration of a probe module and a backend module according to a second modification.

FIG. 7 is a circuit diagram showing a part of the probe module 2 and the backend module 4 according to a second modification. At least one of the cables 8 includes at least one dedicated signal line 16. The digital signal processing unit 116 generates data that indicates the state of the probe module 2. The probe control signal generating unit 206 generates one or multiple second control signals S2 based on the data thus generated, and transmits the second control signals S2 to the probe module 2 via the dedicated signal lines 16.

FIG. 7 shows an arrangement in which the second control signal S2 includes the setting data D3 for controlling the resistance value of the feedback resistor $R_F$. The feedback resistor $R_F$ is configured as a combination of multiple resistor elements and multiple switches. The second control signal S2 includes multiple control signals for switching on and off the multiple switches.

In addition to the gain setting data D3, data that is updated with a low frequency can be selected as the second control signal S2, an example of which includes the data D1 and D2 for setting the bias voltage. Such a modification is capable of further reducing noise emission as compared with an arrangement employing serial transmission.

[Third Modification]

Description has been made in the embodiment regarding an arrangement in which the probe module 2 and the backend module 4 each operate according to a control operation of the computer 6. However, the present invention is not restricted to such an arrangement. That is to say, the measurement apparatus 1 may operate as a standalone apparatus without involving the computer 6.

[Fourth Modification]

The data storage 208 may be detachably connected to the backend module 4. In this case, after the completion of a measurement series by means of the measurement apparatus 1, the user may detach the data storage 208, and may analyze the data using a computer located in a different place.

[Fifth Modification]

The probe module 2 may include a built-in battery. Each active device included within the probe module 2 may operate using the battery as a power supply. Such an arrangement provides the current measurement operation in an environment in which there is no noise that occurs due to a power supply.

[Sixth Modification]

Description has been made in the embodiment regarding a gating nanopore sequencer. Also, the measurement apparatus 1 is applicable to an MCBJ sequencer. In this case, an MCBJ chip is employed instead of a nanopore chip. Instead of such a nanopore structure, a conductor member such as a gold wire or the like, a breaking mechanism for breaking the conductor member, and the like are integrated on the MCBJ chip. In this case, the probe module 2 is provided with an amplifier (a part of the signal generating circuit 118) so as to drive the breaking mechanism. Alternatively, the waveform generator 120 may be used as such an amplifier that drives the breaking mechanism.

Furthermore, it can be said that the usage of the measurement apparatus 1 is not restricted to such a DNA sequencer. Also, the measurement apparatus 1 is widely applicable to various kinds of applications that measure a microscopic current.

While the preferred embodiments of the present invention have been described using specific terms, such description is for illustrative purposes only, and it is to be understood that changes and variations may be made without departing from the spirit or scope of the appended claims.

What is claimed is:

1. A measurement apparatus structured to measure a current signal that flows through a device under test, the measurement apparatus comprising:

a transimpedance amplifier structured to convert the current signal into a voltage signal;

a digitizer structured to convert the voltage signal into first digital data; and a digital signal processing unit structured to perform signal processing on the first digital data, and that controls the measurement apparatus; and a computer interface to be coupled to an external computer configured to execute a program, wherein the computer is separate from the digital signal processing unit, wherein the measurement apparatus has a configuration comprising a first module and a second module which are separated one another, and the first module is located in the vicinity of the device under test during a measurement, and the second module is coupled to the first module via at least one cable, and the first module is covered by a first housing, and the second module is covered by a second housing;

wherein the transimpedance amplifier is built into the first module, wherein the digitizer, the digital signal processing unit and the computer interface are built into the second module, wherein the device under test is configured as a measurement chip which has a first electrode and a second electrode that faces each other, a first pad coupled to the first electrode and a second pad coupled to the second electrode, the first pad and the second pad are formed on a planer surface of the measurement chip, and wherein the first module further comprises a first pin and a second pin, which are located at a bottom surface of the first module such that the first pin and the second pin are to be contact to the first pad and the second pad respectively and simultaneously while measurement.

2. The measurement apparatus according to claim 1, further comprising a transmitter amplifier that is built into the first module, and structured to transmit an output signal of the transimpedance amplifier to the digitizer.

3. The measurement apparatus according to claim 1, further comprising a waveform generator that is built into the second module, structured to receive digital waveform data from the digital signal processing unit, and to generate an analog voltage that corresponds to the digital waveform data.

4. The measurement apparatus according to claim 3, further comprising a receiver amplifier that is built into the first module, structured to receive the analog voltage, and to output the analog voltage thus received to the device under test.

5. The measurement apparatus according to claim 1, wherein said at least one cable comprises a serial bus, wherein the digital signal processing unit is structured to generate a third control signal for controlling the first module, and wherein the digital signal processing unit transmits the third control signal to the first module via the serial bus.

6. The measurement apparatus according to claim 1, wherein said at least one cable comprises a dedicated signal line, wherein the digital signal processing unit is structured to generate a fourth control signal for controlling the first module, and wherein the digital signal processing unit is structured to transmit the fourth control signal to the first module via the dedicated signal line.

7. The measurement apparatus according to claim 1, further comprising a waveform generator that is built into the first module, structured to receive digital waveform data, and to generate an analog voltage that corresponds to the digital waveform data.

8. The measurement apparatus according to claim 1, further comprising:

a guard metal member formed within the first module such that the guard metal member is located in the vicinity of a signal line via which the current signal is transmitted; and a guard amplifier that is built into the first module, and structured to apply a virtual ground voltage of the transimpedance amplifier to the guard metal member.

9. The measurement apparatus according to claim 1, further comprising a first voltage source that is built into the first module, and structured to generate a first voltage that determines the virtual ground voltage of the transimpedance amplifier.

10. The measurement apparatus according to claim 9, wherein the first voltage source is structured to generate the first voltage having a voltage level that corresponds to a third control signal generated by the digital signal processing unit.

11. The measurement apparatus according to claim 1, further comprising a second voltage source that is built into the first module, and structured to generate a second voltage to be supplied to the device under test.

12. The measurement apparatus according to claim 11, wherein the second voltage source is structured to generate the second voltage having a voltage level that corresponds to a fourth control signal generated by the digital signal processing unit.

13. The measurement apparatus according to claim 11, wherein a measurement target of the measurement apparatus is a current that flows between the first electrode and the second electrode, wherein a virtual ground voltage of the transimpedance amplifier is set to a ground voltage, and wherein the second voltage source supplies the second voltage to the second electrode.

14. The measurement apparatus according to claim 1, wherein the first module comprises a power supply terminal for receiving a DC power supply voltage.

15. The measurement apparatus according to claim 1, further comprising a data storage built into the second module.

16. The measurement apparatus according to claim 1, further comprising a data storage detachably connected to the second module.

* * * * *